(12) United States Patent
Hintikka et al.

(10) Patent No.: US 11,175,438 B1
(45) Date of Patent: Nov. 16, 2021

(54) OPTOELECTRONICALLY FUNCTIONAL MULTILAYER STRUCTURE HAVING EMBEDDED LIGHT-DEFINING SEGMENTS AND RELATED MANUFACTURING METHOD

(71) Applicant: TactoTek Oy, Oulunsalo (FI)

(72) Inventors: Juha-Matti Hintikka, Oulunsalo (FI); Miikka Kärnä, Oulunsalo (FI); Heikki Tuovinen, Oulunsalo (FI); Tuomas Nieminen, Oulunsalo (FI); Johannes Soutukorva, Oulunsalo (FI); Ville Wallenius, Oulunsalo (FI); Tero Rajaniemi, Oulunsalo (FI); Tomi Simula, Oulunsalo (FI); Jari Lihavainen, Oulunsalo (FI); Mikko Heikkinen, Oulunsalo (FI); Jarmo Sääski, Oulunsalo (FI); Hasse Sinivaara, Oulunsalo (FI); Antti Keränen, Oulunsalo (FI); Ilpo Hänninen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 17/321,740

(22) Filed: May 17, 2021

(51) Int. Cl.
*G02B 5/00* (2006.01)
*B29D 11/00* (2006.01)
*G02F 1/1335* (2006.01)
*G02F 1/1362* (2006.01)

(52) U.S. Cl.
CPC .......... *G02B 5/005* (2013.01); *B29D 11/0073* (2013.01); *B29K 2995/0018* (2013.01); *G02F 1/133512* (2013.01); *G02F 1/136209* (2013.01)

(58) Field of Classification Search
CPC ......... B29D 11/0073; B29K 2995/0018–0036; G02B 5/005; G02F 1/133512; G02F 1/136209
See application file for complete search history.

(56) References Cited

U.S. PATENT DOCUMENTS

| 6,521,830 B1 | 2/2003 | Platz |
| 2018/0149321 A1* | 5/2018 | Torvinen .............. H05K 1/0296 |

* cited by examiner

*Primary Examiner* — Ryan S Dunning
(74) *Attorney, Agent, or Firm* — Robert P. Michal, Esq.; Carter, DeLuca & Farrell LLP

(57) ABSTRACT

An optoelectronically functional multilayer structure and related methods of manufacturing an optoelectronically functional multilayer structure, such structure including an optionally thermoplastic formable substrate film, electronics comprising preferably light-emitting and/or light-sensitive elements, an optically transmissive layer, and a light-blocking layer defining a number of structural channels extending in at least a first direction.

23 Claims, 10 Drawing Sheets

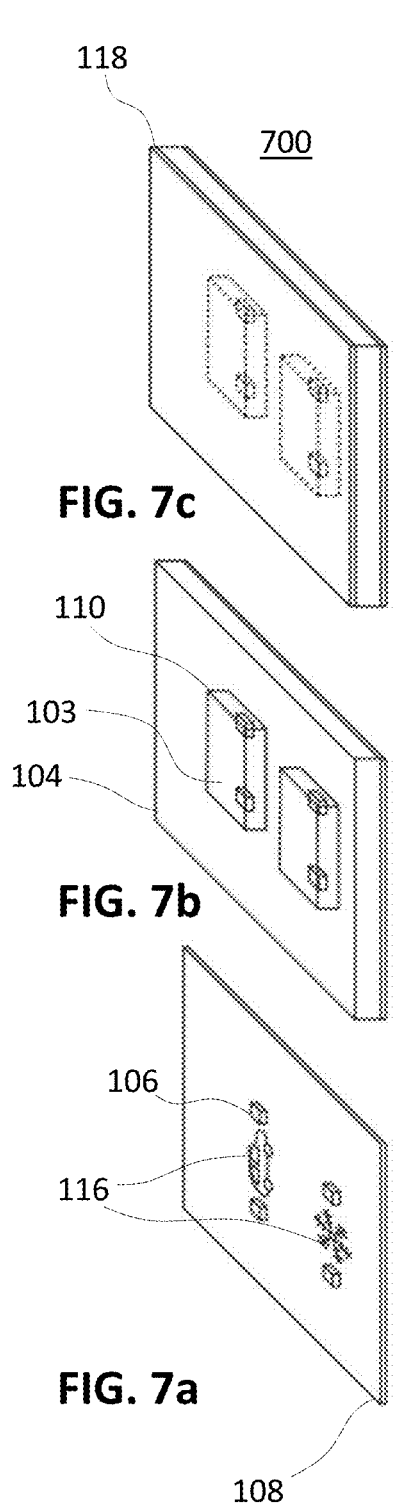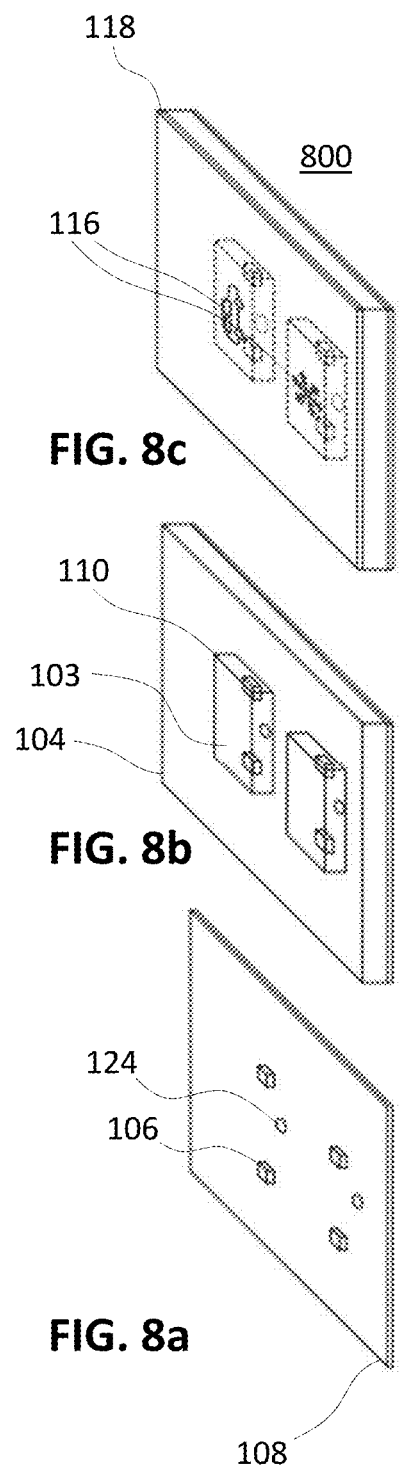

OPTOELECTRONICALLY FUNCTIONAL MULTILAYER STRUCTURE HAVING EMBEDDED LIGHT-DEFINING SEGMENTS AND RELATED MANUFACTURING METHOD

TECHNICAL FIELD

Generally, the present invention relates to electronics, associated devices, structures and methods of manufacture. In particular, however not exclusively, the present invention concerns a multilayer assembly with illuminated portions perceivable in the environment.

BACKGROUND

Generally, there exists a variety of different stacked multilayer assemblies and structures and related manufacturing techniques in the context of electronics and electronic products.

In a manufacturing concept of in-mould structural electronics (IMSE) functional devices and parts therefor are stacked into the form of a multilayer structure encapsulating e.g., electronic and optical functionality of the structure as seamlessly as possible. What is characteristic to IMSE is that the electronics and optional further embedded features such as optics are commonly manufactured into a true 3D (non-planar) form in accordance with the 3D models of the overall target product, part or generally design. To achieve the desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired 3D shape and subjected to overmoulding, for example, by suitable plastic material that covers and embeds the underlying elements, thus protecting and potentially hiding them from the environment.

U.S. Pat. No. 6,521,830 presents a housing for electrical or electronic devices or components comprising a moulding of thermoplastic material which has at selected locations on its surface electrical conductor tracks with contact pins attached at predetermined locations, whereby electronic components, such as sensors, microswitches or surface-mounted devices may be applied to the electrical conductor tracks being subsequently encapsulated at the same time and sealed by a second layer of thermoplastic material.

However, there are various challenges related to the known solutions that utilise e.g., light conveying or illumination in the context of IMSE. For instance, so-called light leakage or crosstalk phenomena are common issues with solutions involving a greater number of optically functional components or elements disposed in the same structure, among other potential factors to be considered. Additionally, in manufacturing e.g., the alignment of the substrate layer comprising the number of optically functional elements with other, subsequent layers may turn out time-consuming and technically difficult. Generally, one could say that controllability of features embedded or conveyed in IMSE structures, such as light, may still remain a challenge in a number of use cases while also integration level, product weight and size, durability, manufacturing process complexity and yield, product and process cost as well as capability to include additional functionalities e.g., in terms of sensing, communications, data processing and data storage, in the obtained integrated structures are examples of a plethora of further aspects that have to be thought of in the design and manufacturing of solutions falling under or reminding of the IMSE concept.

SUMMARY

An objective of the present invention is to at least alleviate one or more of the above drawbacks or challenges associated with the existing solutions in the context of integral multilayer structures, such as especially IMSE structures, and electronic or other functionalities embedded therein.

The aims of the invention are obtained with a multilayer structure and related method of manufacture, which are characterized in what is presented in the independent claims. Some advantageous embodiments of the invention are presented in the dependent claims.

A method for manufacturing an optoelectronically and/or otherwise functional multilayer structure according to one aspect of the present disclosure comprises:

a first step of providing an optionally thermoplastic, (3D-)formable such as thermoformable substrate film comprising a first and opposite second side, optionally wherein the first side is towards the selected top and the second side is towards the selected bottom of the structure;

a second step of arranging the substrate film with electronics, wherein the electronics includes a number of optically functional, preferably light-emitting and/or light-sensitive, elements disposed on respective light-defining segments of the first side of the substrate film and a circuit design comprising a number of circuit traces connecting to the number of optically functional elements;

a third step of producing, preferably by moulding, an optically transmissive layer upon the first side of the substrate film so that at least the light-defining segments including the number of optically functional elements are at least partially embedded in and optically coupled to the transmissive layer; and a fourth step of providing a light-blocking layer upon the substrate film and further securing the transmissive layer between the light-blocking layer and the substrate film, the light-blocking layer defines a (first) number of structural channels whose proximal ends are upon the respective light-defining segment, wherein the transmissive layer establishes at least partially the internals of the structural channels extending in a first direction, coinciding essentially with a thickness direction of the structure being optionally towards the selected top of the structure.

In the above, the mutual order of disclosed steps is preferably the indicated one.

In the method, the fourth step may include forming at least one opening from the number of structural channels through the light-blocking layer in the first direction preferably so that a proximal end of each of the at least one opening is upon and towards the respective light-defining segment and a distal end of each of the at least one opening defines an exit on another side of the light-blocking layer. Said another side of the light-blocking layer is in this context preferably towards environment where e.g., a user of the multilayer structure perceiving the light potentially created and emitted by the structure may be located.

In the method, the fourth step includes forming at least one vacant from the number of structural channels so that a proximal end of the at least one vacant is upon the respective light-defining segment and a distal end of the at least one vacant forms a top of the vacant, the vacant extending in the first direction from the respective light-defining segment and the top of the at least one vacant being in the proximity of another side of the light-blocking layer, wherein the thickness of the light-blocking layer in the respective vacant is locally reduced.

In the method, the third step may include moulding the optically transmissive layer, at least partially upon the first side of the substrate film, wherein the transmissive layer comprises a thicker portion of the material of the transmissive layer in the first direction upon at least one light-defining segment to establish at least partially the internals of at least one structural channel.

In the method, the third step may include laminating of at least one piece of the material of the optically transmissive layer with the substrate film, optionally preceding by providing an adhesive layer between the optically transmissive layer and the substrate film.

In the method, the fourth step may include laminating of at least one piece of the material of the light-blocking layer with the optically transmissive layer, optionally preceding by providing an adhesive layer between the light-blocking layer and the optically transmissive layer.

The method may comprise a further step, being subsequent or prior the second step, wherein 3D-shaping (3D-forming), preferably by thermoforming, the substrate film to a selected 3D target shape (curved, meandering, dome, or some other preferred and potentially more complex 3D-shape), wherein optionally the light-defining segments are defined by a shape of a recess, groove, pocket, ridge, and/or a protrusion of the substrate film.

In the method, the second step may include arranging into at least one of the light-defining segments at least one electrical element of the electronics selected from the group consisting of light-emitting element, light-sensitive element, photodetector, photovoltaic cell, and pressure-sensitive component.

In the method, the second step may include producing at least part of the electronics, preferably at least the circuit design, by printed electronics technology on the substrate film.

In the method, the fourth step may include moulding the light-blocking layer, at least partially, from at least one source material such as plastics.

In the method, the second step may include providing a masking to the first and/or second side of the substrate film, preferably opaque or translucent, optionally dark-coloured such as substantially black, layer on a base layer accommodating the traces and optionally at least one of the light-emitting elements, optionally film or tape, to block or at least hinder external view of the traces.

In the method, the second step may include providing a first additional film upon the first side of the substrate film, wherein the first additional film optionally contains upon or in at least one light-defining segment thereof at least one element selected from the group consisting of: optical surface relief form, optical surface relief form structure, optical grating structure, printing, printed letter, printed number, printed shape, printed image, printed graphics, and engraved letter, number, shape, image or graphics.

The method may comprise a further step, wherein providing one or more second additional, optically functional, optionally diffusive, films or layers upon a distal end of at least one structural channel of the number of structural channel, wherein at least one of the second additional films or layers optionally contains at least one element selected from the group consisting of: optical surface relief form, optical surface relief form structure, optical grating structure, printing, printed letter, printed number, printed shape, printed image, printed graphics, and engraved letter, number, shape, image or graphics.

An optoelectronically functional multilayer structure according to one aspect of the present invention comprises:

an optionally thermoplastic, formable substrate film comprising a first and opposite second side, optionally wherein the first side is towards the selected top and the second side is towards the selected bottom of the structure;

electronics comprising a number of optically functional, preferably light-emitting and/or light-sensitive, elements being disposed in respective light-defining segments of the first side of the substrate film, and a circuit design comprising a number of electrically conductive circuit traces connecting to the number of optically functional elements;

an optically transmissive layer upon the first side of the substrate film so that at least part of each light-defining segments including the number of optically functional elements, is at least partially embedded in and optically coupled to the transmissive layer; and an optically substantially opaque light-blocking layer disposed onto the first side of the substrate film, the light-blocking layer defining a number of structural channels configured at least partially of the material of the transmissive layer, wherein the number of structural channels being formed to extend at least in a first direction, coinciding with a thickness direction of the structure being optionally towards the selected top of the structure, i) to convey light emitted by at least one optically functional element towards the environment being optionally upon the selected top of the structure and/or convey light onto at least one optically functional element from the environment, so that the light-blocking layer at least partially optically isolates the light-defining segments from each other, and ii) to secure the optically transmissive layer between the light-blocking layer and the substrate film.

In the multilayer structure, at least one structural channel from the number of structural channels is formed to extend through the light-blocking layer in the first direction so that a proximal end of the at least one structural channel on one side of the light-blocking layer defines at least partly an edge of the respective light-defining segment and a distal end of the at least one structural channel defines an exit on another side of the light-blocking layer.

In the multilayer structure, at least one structural channel from the number of structural channels maybe formed to define a vacant into the light-blocking layer so that a proximal end of the at least one structural channel on one side of the light-blocking layer defines at least partly an edge of the respective light-defining segment and a distal end of the at least one structural channel forms a top of the vacant in the proximity of another side of the light-blocking layer, wherein the thickness of the light-blocking layer in the respective structural channel is locally reduced.

In the multilayer structure, the light-blocking layer and the optically transmissive layer may comprise an adhesive layer, optionally heat-activated film, interposed therebetween.

In the multilayer structure, the optically transmissive layer and the substrate film comprise an adhesive layer, optionally heat-activated film, interposed therebetween.

In the multilayer structure, the electronics comprises at least one electrical element selected from the group consisting of light-emitting element, light-sensitive element, photodetector, photovoltaic cell, and pressure-sensitive component, disposed on at least one of the light-defining segments.

In the multilayer structure, at least part of the electronics, optionally of at least the circuit design, being preferably produced by printed electronics technology on the substrate film.

In the multilayer structure, the first and/or second side of the substrate film may comprise a masking, preferably opaque or translucent, optionally dark-colored such as substantially black, layer on a base layer accommodating the traces and optionally at least one optically functional element, optionally film or tape, to block or at least hinder external view of the traces.

In the multilayer structure, the first side of the substrate film optionally comprises a first additional film containing optionally upon or in at least one light-defining segment at least one element selected from the group consisting of: optical surface relief form, optical surface relief form structure, optical grating structure, printing, printed letter, printed number, printed shape, printed image, printed graphics, and engraved letter, number, shape, image or graphics.

The structure may comprise one or more second additional, optically functional, optionally diffusive, films or layers upon the light-blocking layer, wherein at least one of the second additional films or layers optionally contains at least one element upon a distal end of at least one structural channel of the number of structural channels of the light-blocking layer selected from the group consisting of: optical surface relief form, optical surface relief form structure, optical grating structure, printing, printed letter, printed number, printed shape, printed image, printed graphics, and engraved letter, number, shape, image or graphics.

In the multilayer structure, various layers and elements included such as the optically functional elements, molded layer(s) such as optically transmissive layer and possibly light-blocking layer, and/or the substrate film layer may comprise optically substantially opaque, translucent or transparent material, at least in places, enabling e.g. visible light and/or other preferred light wavelengths to pass through it with negligible loss. The sufficient optical transmittance (transmission) at desired wavelengths may in the latter cases be at least about 70%, 75%, 80%, 85%, 90%, 95% or even higher, for example.

These higher transmissivity elements include e.g., the optically transmissive layer of the multilayer structure contemplated herein. The light-blocking layer and optionally further element(s) not aimed to transmit incident light therethrough may in turn have transmittance less than about 50%, 40%, 30%, 20%, 10%, 5%, 2%, or less. The considered wavelengths may indeed vary embodiment-specifically and having regard to some embodiments/elements, transmittance of substantially all visible wavelengths of light may be relevant whereas in some other embodiments involving other wavelengths of electromagnetic radiation in terms of transmission or capture, the interest may reside in more specific, different or broader bandwidth(s), for instance.

Generally, feasible moulding methods include e.g. injection moulding. In the case of several plastic materials included in the structure, they may be moulded using a two-shot or generally multi-shot moulding method. A moulding machine with multiple moulding units may be utilised. Alternatively, multiple machines or a single re-configurable machine could be used for sequentially providing several materials.

The utility of the present invention results from a variety of factors depending on each particular embodiment in question.

For example, the alignment of the substrate film, electrical components such as optically functional elements and optional features such as graphics or other informative elements of the further layer or film of the structure may be easier as it is with the known methods. As a number of separate portions of the injected or moulded transmissive layer can be isolated from each other and fixed to the substrate film by the light-blocking layer, elongation stresses to the substrate film and elements thereon during the injection or moulding process(es) may be reduced.

As the structure may be arranged to a substantially non-planar, e.g. curved, shape, it may more conveniently find use in applications wherein the use of planar shapes is not possible or at least desired either for aesthetical or functional reasons e.g. in terms of host device/slot/environment dimensions.

Yet, the obtained structure may be easily mounted on a target surface. The structure may remain relatively light and flat with high degree of integration. It may even comprise integral support and/or attaching elements such as bosses for positioning and fixing purposes. The manufacturing process is rapid, affordable and provides good yield.

Still, according to the present invention, it is possible to provide e.g., optoelectronically functional multilayer structure capable of preventing leakage or crosstalk phenomena in cases where the structure involves a greater number of optically functional components and optoelectrical functionalities, and a method for manufacturing such an optoelectronically functional multilayer structure.

The expression "a number of" may herein refer to any positive integer starting from one (1).

The expression "a plurality of" may refer to any positive integer starting from two (2), respectively.

The terms "first" and "second" are herein used to distinguish one element from other elements, and not to specially prioritize or order them, if not otherwise explicitly stated.

The previously presented considerations concerning the various aspects and embodiments of the method may be flexibly applied to the aspects and embodiments of the multilayer structure mutatis mutandis, and vice versa, as being appreciated by a skilled person.

BRIEF DESCRIPTION OF THE DRAWINGS

Next the invention will be described in greater detail with reference to exemplary embodiments in accordance with the accompanying drawings, in which:

FIGS. 7a, 7b and 7c illustrates still a further variation of a multilayer structure in accordance with the present disclosure;

FIGS. 8a, 8b and 8c illustrates still a further variation of a multilayer structure in accordance with the present disclosure;

DETAILED DESCRIPTION

Figure 1:
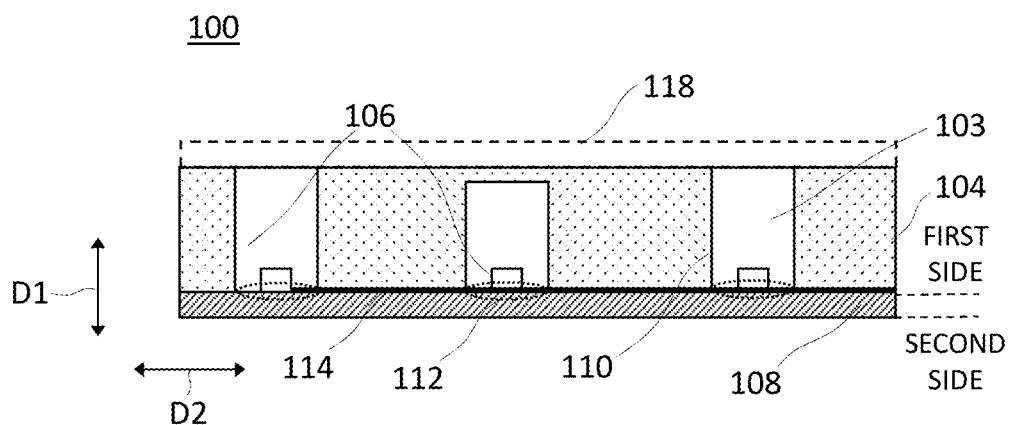
FIG. 1 illustrates one embodiment of a multilayer structure in accordance with the present disclosure via a partial cross-sectional side view.

In respective figures, the same or corresponding parts are denoted by the same reference numerals, and in most cases duplicate textual description will be omitted as well.

FIG. 1 illustrates, by means of a cross-sectional side view, many general concepts of various embodiments of the present invention via one, merely exemplary, realization of a multilayer structure at 100.

The depicted, still merely exemplary, structure 100 is shown to exhibit a rather flat general shape in favour of clarity. However, a person skilled in the art shall appreciate the fact the optimum shape may be determined case specifically based on e.g., optical, structural, dimensional or aesthetic design objectives. Accordingly, the resulting overall shape and/or constituent shapes of the included elements or portions of the structure could also be more radically three-dimensional, incorporating e.g., curved or angular portions at least locally, in addition to or instead of substantially planar surfaces. Yet, a finer scale surface texture of the structure 100 may be constant or spatially vary. The texture may contain e.g., flat and/or grainy portions due to e.g., materials used or surface type microstructures such as optical microstructures provided to the surface layer.

The finished multilayer structure 100 may, either as such or subsequent to further processing, effectively establish an end product of its own, e.g., an electronic device, or be disposed in a host device or element as a building block or component module thereof. It 100 may naturally comprise a number of further elements or layers not shown in the figure.

The structure 100 contains a substrate film 108 as discussed hereinbefore.

The substrate film 108 and/or any additional layer or film in the structure (e.g., first or second additional layer 118) may comprise or consist of material(s) such as plastics and/or organic or biomaterials with reference to e.g., wood, leather or fabric, or a combination of any of these materials with each other or with metals, for instance. The film may comprise or consist of generally thermoplastic material. The film may be essentially flexible or bendable. In some embodiments, the film 108 could alternatively be substantially rigid. The thickness of the film may vary depending on the embodiment; it may only be of few tens or hundreds of a millimeter, or considerably thicker, in the magnitude of one or few millimeter(s), for example.

The film 108 may, for example, comprise at least one material selected from the group consisting of: polymer, thermoplastic material, thermoplastic polymer, electrically insulating material, PMMA (polymethyl methacrylate), poly carbonate (PC), copolyester, copolyester resin, polyimide, a copolymer of methyl methacrylate and styrene (MS resin), glass, polyethylene perephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

The substrate film 108 may be configured to host e.g., electronics which comprise e.g. three separate optically functional elements 106 being disposed in respective light-defining segments 112 on a first side of the substrate film 108, as shown in FIG. 1. The electronics may further comprise circuit traces 114 that electrically connect to the optically functional elements 106. Yet, the substrate film 108 may be configured to host, either on the same or opposite ('second') side, a number of further electrical or specifically electronic elements, and/or elements of different nature.

Indeed, in this and other embodiments of the present invention, the multilayer structure 100 or specifically the substrate 108 provided may include a number of functional elements including at least one functional element selected e.g., from the list consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, red (emitting) LED, green LED, blue LED, RGB LED, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single electrode capacitive switch or sensor, capacitive button, multi-electrode capacitive switch or sensor, self-capacitance sensor, mutual capacitive sensor, inductive sensor, sensor electrode, micromechanical (MEMS) component, UI element, user input element, vibration element, sound producing element, communication element, transmitter, receiver, transceiver, antenna, resonator, infrared (IR) receiver or transmitter, wireless communication element, wireless tag, radio tag, tag reader, data processing element, data storage or memory element, electronic sub-assembly, light directing element, lightguide, lens and reflector.

The multilayer structure 100 further includes an optically substantially opaque light-blocking layer 104 and an optically transmissive layer 103 disposed onto the first side of the substrate film 108, as shown in FIG. 1. The two 103, 104 may be arranged to alternate and/or establish various other configurations. The light-blocking layer 104 comprises or defines structural channels 110 that are either through or blind holes in a direction (first direction) D1. The structural channels 110 may be fully or partially configured of, or basically filled with, the material of the transmissive layer 103. The optically functional elements 106 are at least partially embedded in and optically coupled to the transmissive layer 103. As shown in FIG. 1, preferably the edges of the light-defining segments 112 on the first side of the substrate film 108 are at least partially defined by the proximal end of the respective structural channel 110, and therefore, the light-defining segments 112 are at least partially optically isolated from each other.

The material(s) of the light-blocking layer 104 and/or transmissive layer 103 may comprise e.g. thermoplastic and/or thermosetting material(s). Thickness of the moulded or otherwise produced layer(s) may vary depending on the embodiment. It may be, for example, in the order of magnitude of less than one, one, few or tens of millimeters. E.g. the molded material may be electrically insulating. In more detail, an included layer such as light-blocking 104 or transmissive 103 layer may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

A number of circuit traces 114, or 'wiring', may have been provided to supply the electronics such as optically functional element(s) 106 with power from an internal or external power source as appreciated by a person skilled in the art. Yet, there may be traces 114 for conveying signals (e.g., control signals and/or (other) data) between different elements of the on-board electronics, i.e., electronics included in the structure 100, and/or between the electronics included in the structure 100 and an external device or structure. Same traces 114 may be even used jointly for power and data communication.

Optically functional element 106 may be an electrical element selected from the group consisting of light-emitting element such as LED, light-sensitive element, photodetector or photovoltaic cell.

Traces 114, conductive portions of optically functional elements 106 and/or other conductive features included in the structure 100 may include at least one material selected from the group consisting of: conductive ink (or paint), conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

Yet, any of the structural channels 110 could be associated with multiple optically functional elements 106 instead of only one, the latter option however being the situation shown in the figure in favour of clarity. The elements 106 could be mutually aligned as desired. Two or more of elements 106 could be positioned in a row, matrix, circular, or other selected formation, either having regard to a certain channel 110 or generally.

Material of the transmissive layer 103 is configured to convey light emitted by the at least one optically functional element 106 or to convey light from the environment to the at least on optically functional element 106, and therefore has, for such purpose, suitable transmission characteristics such as sufficient transmittance in the wavelengths/frequencies of interest, optionally including or limiting to visible light and/or other selected wavelengths emitted by the optically functional element 106 and/or wavelengths of light conveyed from the environment.

Generally, the desired total transmission at the wavelengths of interest may naturally vary depending on a particular embodiment to be implemented but generally, the plastic material used to establish e.g., the transmissive layer 103 comprises optically substantially transparent or translucent material having regard to selected frequencies or wavelengths thus enabling the frequencies/wavelengths to pass through it with low enough loss. Sufficient total transmission of the layer 103 at the relevant wavelengths may thus vary depending on the embodiment, but may be about 50%, 60%, 70%, 75%, 85%, 90% or 95% or higher, for example, as already briefly discussed hereinbefore.

Generally, in various embodiments power supply to any element such as optically functional elements or control/processing devices hosted by the multilayer structure may be at least partially arranged by an included battery or other locally provided power source. Yet, to arrange suitable power to a number of electrical or specifically electronic elements included in the multilayer structure from the source, a specific power circuitry including e.g., a number of converter(s) may be utilized. A number of electrical conductors or circuit traces 114, connectors and/or cabling, may be harnessed into power transfer as well as communication purposes between different elements and/or between the structure 100 and external elements.

The light-blocking layer 104 may contain thermally conductive material such as selected metal and/or thermally conductive features on or within the layer 104. This material may be configured to operate as a heat sink.

The light-blocking layer 104 may be configured to interface with external structures or devices. For the purpose, the layer 104 may contain a number of fixing features. These fixing features may be e.g., chemical based (adhesion) or suitable shaped mechanical based means designed for fixing the external structures or devices to the structure.

The structure may comprise an additional film 118 upon another side of the transmissive layer 103 and/or light-blocking layer 104 opposite the substrate film 108. The additional film 118 may be optically or otherwise functional; it may be at least selectively optically transmissive, opaque, diffusive and/or collimating, for example. The additional film 118 may hosts elements similarly or different from the ones of the substrate film 108, e.g., light sources 112 and even transmissive layer 103 (extending or not extending through the structure to the substrate film 108).

The substrate film 108 and/or other layer of the structure which can be embedded in or on the structure can have a reflective, scattering and/or otherwise optical function.

Various general principles already set forth hereinbefore in relation to FIG. 1 or without explicit reference to any figure appended herewith, regarding e.g. included elements, their functionalities, materials, other properties as well as their mutual configurations within the structure, are selectively adoptable and applicable basically in any embodiment of the present disclosure as being easily understood by a skilled person, for which reason they are not unnecessarily repeated below in connection with the description of the remaining figures. Likewise, additional features disclosed for the first time below in connection with the description of any remaining figure can be flexibly adopted in other illustrated or merely textually described embodiments unless explicitly stated to the contrary.

Figure 2:
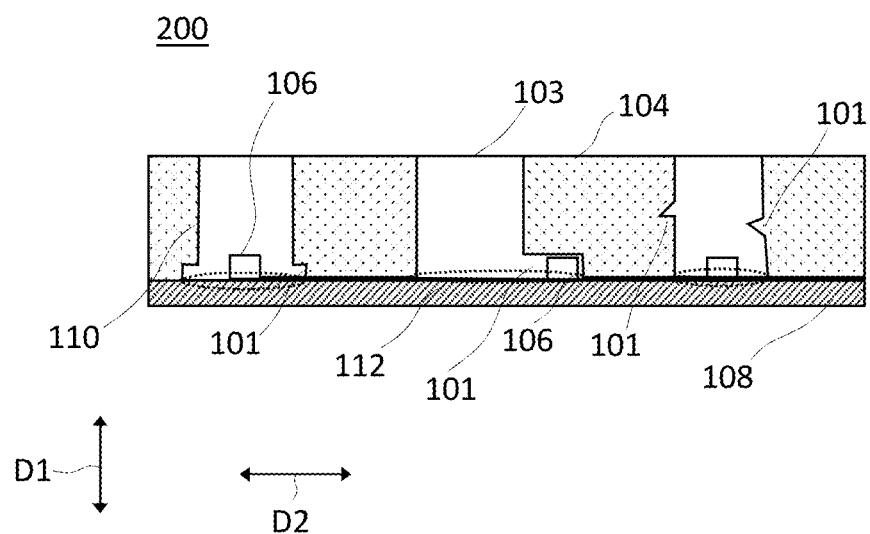
FIG. 2 illustrates a variation of the embodiment of FIG. 1.

FIG. 2 shows at 200 a variation of the structure that differs from the embodiment of FIG. 1 in that it includes a number of protrusions or recess 101 in the structural channels that extend either inwards or outwards in a second direction D2 (width) perpendicular to the first direction D1. As shown in FIG. 2 a protrusion or recess 101 may either locate directly on and connected to the first side of substrate film 108 or further on a side between the proximal and distal end of the structural channel 110. A protrusion or recess 101 may bear e.g., rectangular, wedge or double-wedge shape. An optically functional element 106 may locate in the protrusion 101, as shown in FIG. 2. The protrusions improve the securing between the light-blocking layer 104 and transmissive layer 103 and/or the positioning of the transmissive layer 103.

Generally, two or more structural channels 110 could also be connected with each other, optionally via further structural channels 110 (not shown in the figures).

Figure 3A:
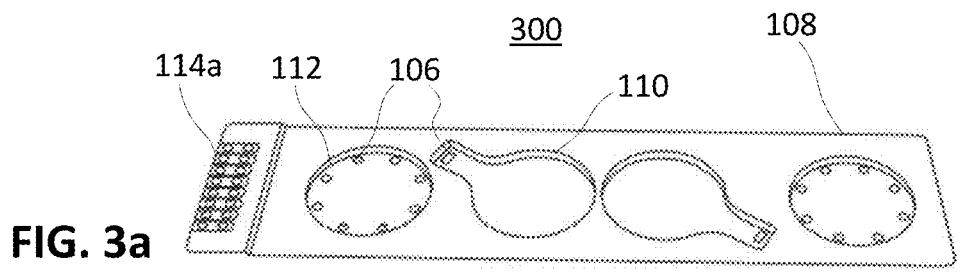
FIGS. 3a, 3b, 3c and 3d illustrate a further variation of a multilayer structure in accordance with the present disclosure.
Figure 3B:
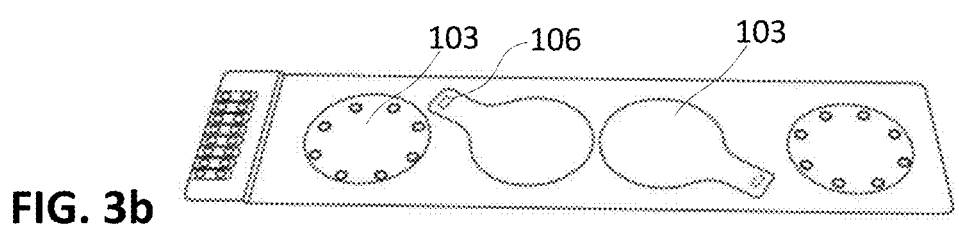
Figure 3C:
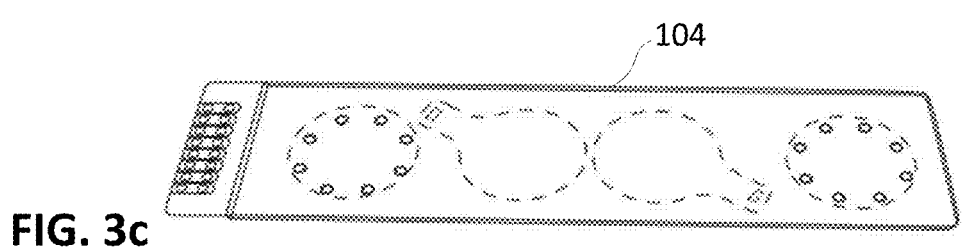
Figure 3D:
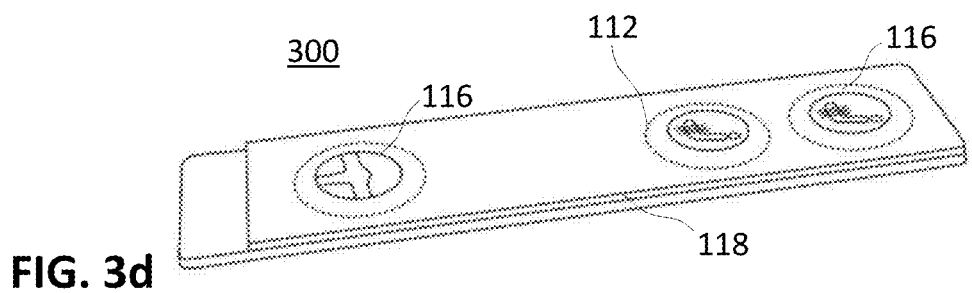

FIGS. 3a-3d illustrate a multilayer structure 300 in four different degrees of completion in favour of clarity. In FIG. 3a a number of optically functional elements 108 are being disposed on four isolated, separated light-defining segments 112. In this design, the light-defining segments 112 are being formed to recesses of the substrate film 108. In FIG. 3b the recesses of the light-defining segments 108 are being filled/moulded by material of a transmissive layer 103 whereby the optically functional elements 108 are at least partially embedded in and optically coupled to the transmissive layer 103. In FIG. 3c an optically substantially opaque light-blocking layer 104 is being disposed on the structure of 300 of the FIG. 3b so as light conveying between the different light-defining segments 112 is at least partially blocked by the disposed light-blocking layer 104 but light conveying from and to optically functional elements 108 on the individual light-defining segments 112 and environment on top of the structure is allowed within the transmissive layer 103 inside the structural channels 110. This may be provided so that the transmission of the light-blocking layer 104 varies, being higher at the position (i.e., upon) of the light-defining segments 112, i.e., at the structural channels, and substantially less, optionally 104 may be opaque, at the portions that are not upon the segments 112, i.e., outside of the structural channels 110. Varying transmission of the layer 104 may be manufactured so that e.g., colour particles which reduce transmission properties are arranged into the portions of the layer 104 that are not upon the segments 112. As appreciated by a person skilled in the art, also other methods may be used to provide varying transmission for the light-blocking layer 104. In FIG. 3d at least one second additional film or layer 118 is being provided on the top of the structure of 300 of FIG. 3c so as there is an optional informative element 116 upon three light-defining segments 112 in the at least one second additional film or layer 118. In FIGS. 3a-3c is shown a connector 114a that may be used to connect 300 to a host device, structure or element (not shown in the figures).

Generally, the desired total light-blocking, i.e., blocking of transmission of light at the wavelengths of interest may naturally vary depending on a particular embodiment to be implemented but generally, the plastic or other material used to establish opaque or partial opaque e.g., the light-blocking layer 104 comprises optically substantially opaque material having regard to selected frequencies or wavelengths thus enabling the frequencies/wavelengths to prevent through it. Sufficient total transmission of the layer 104 at the relevant wavelengths may thus vary depending on the embodiment, but may be about 50%, 40%, 30%, 20%, 10%, 5%, 2%, 1% or 0%, for example, and hence, optical transmissivity of the layer 104 may be configured to be substantially smaller than optical transmissivity of the optically transmissive layer 103.

At least one further film or generally layer, such as at least one second additional film or layer 118 or the first additional film may have been provided, incorporating e.g., diffusing optics and/or printing. In this context by the first additional film is meant a film or layer that is disposed either directly onto the first surface of the substrate film 108 or so that there is an adhesive layer or the like between the first surface of the film 108 and the first additional film. In this context by the second additional film or layer 118 is meant a film or layer that is subsequent to the layers 103 and 104 in the structure, constituting possibly at least portion of a top cover of the structure.

In some embodiments, a number of further layers or films such as a molded layer may have been provided also on the second side of the substrate film 108 (not shown in the figures). These further layers may have isolating, protective, decorative, optical and/or attaching function, for example.

IML (in-mould labelling)/IMD (in-mould decoration) technique may have been applied to provide embedded graphics, colours, etc. within the structure, optionally specifically to the substrate film 108, and/or other films/layers thereof.

As mentioned hereinbefore, 3D-forming via e.g., a thermoforming process such as vacuum or pressure forming, may have been applied to introduce a substantially three-dimensional shape, e.g., a number of recesses as shown in embodiment 300, to a target element or portion of the multilayer structure, with particular reference to the substrate film layer 108. Few practical examples for the lower limit of usually suitable thermoforming temperatures (degrees Celsius) include: PC 150, PET 70, and ABS 88-120. The pressure applied on a target film obtained either by pressing mechanically air into the mould or by sucking a vacuum into the mould could be roughly over some 100 psi for a single layer film construction whereas it could be roughly over some 200 psi for laminated structures. The used film and the process parameters shall be preferably selected such that said film does not melt unless so desired.

In terms of molding parameters, few further merely exemplary guidelines could be given. When the target film such as substrate film 108 is e.g., PET and the plastics to be, for example, injection moulded thereon is PC, the temperature of the melted PC may in common cases be about 280 to 320 degrees Celsius and the mould temperature about 20 to 95 degrees Celsius, e.g., about 80 degrees Celsius. The used film and the process parameters shall be preferably selected such that said film does not melt and remains substantially solid during the process unless otherwise desired. The film shall be positioned in the mould such that it remains properly fixed. A person skilled in the art will appreciate the fact that best forming and molding parameters depend, e.g., on the used materials and target characteristics of the structure to be established, whereupon they should be, in optimum case, selected case-specifically by relying on the known properties and behaviour of the materials when subjected to thermal stress and physical stress such as stretching caused by e.g., pressure/vacuum. Yet, special care shall be taken to preserve the electronics and possible other elements already provided on the substrate film layer 108 prior to moulding, by the proper selection of the moulding, as well as forming, parameters.

In various embodiments, the multilayer structure may have been arranged with preferably integral, e.g., moulded, features, such as optionally hole/insert-provided bosses (for e.g., rivets or screws) and associated bases, for attaching, spacing and/or positioning the structure relative to external surfaces and e.g., host devices. Yet, a number of integral, preferably moulded, features such as ribs may have been incorporated to reinforce the structure.

Figure 4:
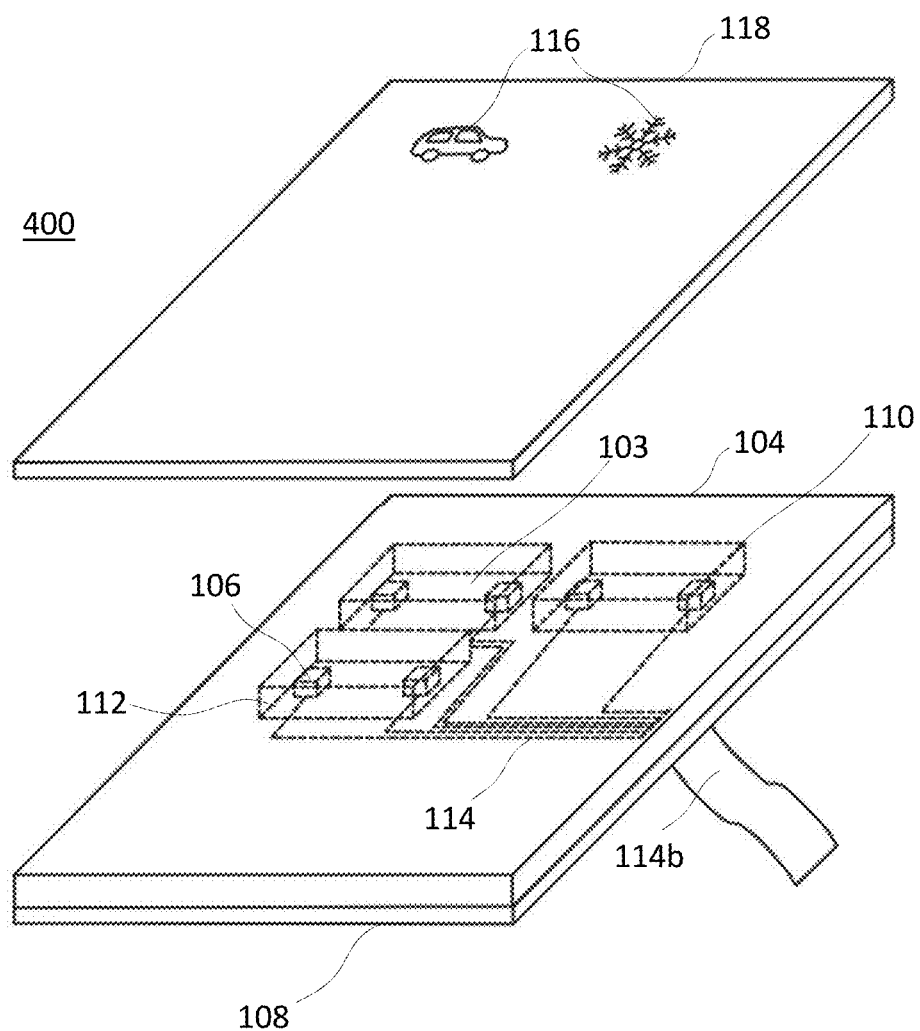
FIGS. 4, 5 and 6 illustrate still further variations of multilayer structures in accordance with the present disclosure.

FIG. 4 shows at 400 a further variation of the structure. 400 has a second additional layer 118 on top of the light-blocking layer 104 and the optically transmissive layer 103, i.e., the layer 118 being subsequent to layer 103 and 104. In the figure the second additional layer 118 is shown separately to exhibit the internal structure of 400. 400 has three separate structural channels 110 defined in the light-blocking layer 104 and filled with material of the transmissive layer 103. In the figure each of the structural channels 110 defines a light-defining segments 112 on the first side of the substrate film 118 including two optically functional elements 106 on the opposite side of the rectangular light-defining segments 112. The optically functional elements 106 are applied to the circuit traces 114 that are encapsulated by the light-blocking layer 104 and/or transmissive layer 103 and may be externally connected to e.g., a host device or element via a flexible connector 114b. In the figure, the second additional layer 118 includes an optional informative element 116 upon distal ends of two structural channels 110 of 400.

Indeed, one or more second additional film or layer 118 may be optically opaque, translucent or substantially transparent. Opaque parts of the layer 118 may be applied, at least in places, in further reducing the crosstalk/leakage between the neighbouring optical channels 110.

Generally, at least one second additional, optically functional, optionally diffusive, film or layer 118 may locate upon a distal end of at least one structural channel 110 of the number of the structural channels 110. The second additional films or layers 118 may optionally contain at least one informative element selected from the group consisting of: optical surface relief form, optical surface relief form structure, optical grating structure, printing, printed letter, printed number, printed shape, printed image, printed graphics, and engraved letter, number, shape, image or graphics.

Figure 5:
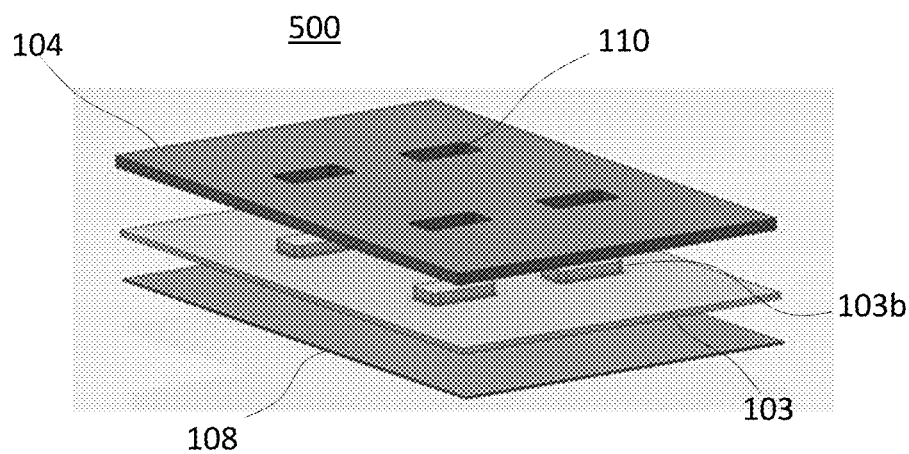

FIG. 5 illustrates, at 500, a further embodiment of the multilayer structure in accordance with the present technology. In the figure the substrate layer 108, transmissive layer 103 and light-blocking layer 104 are shown separately. In 500 the transmissive layer 103 comprises a thin, continuous transmission layer 103 on the first side of the substrate film 108. In this design the layer 103 is higher/thicker at the locations 103b extending to and forming internals of the structural channels 110 in the first direction (D1) towards the selected top. Hence, the light-blocking layer 104 at least partially optically isolates the light-defining segments 112 (not shown in the figure) from each other below the extensions 103b.

Figure 6:
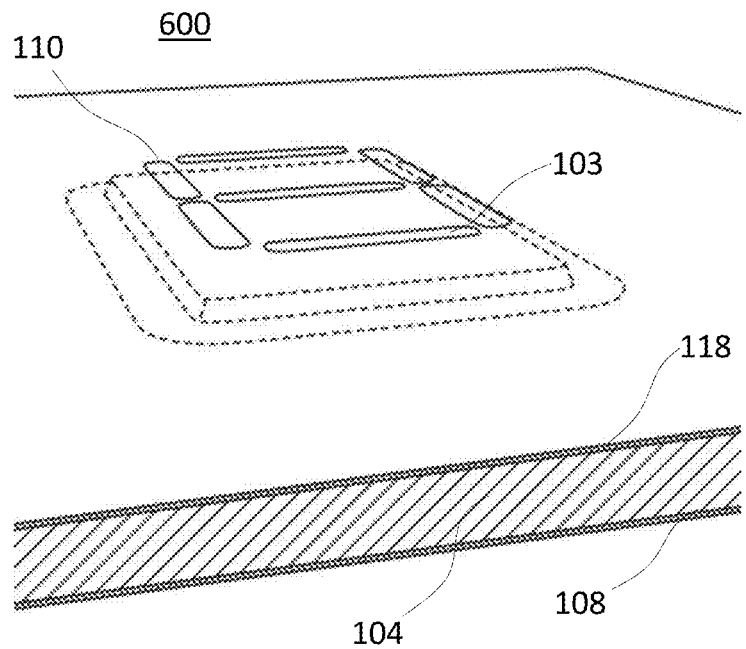

FIG. 6 illustrates, at 600, a further embodiment of the multilayer structure in accordance with the present technology. 600 may represent a seven-segment display. 600 discloses the light-blocking layer 108 on the first side of the substrate film 108. In 600 the light-blocking layer 108 comprises seven structural channels 110 being filled by material of the transmissive layer 103, the structural channels being optically therefore at least partially isolated from each other. There is at least one second additional film or layer 118 on top of the layer 104 having optically transmissive portions upon the light-defining segments 112 and a number of optically functional elements 106 (not shown in the figure) and structural channels 110 upon the respective segments 112. As appreciated by a person skilled in the art, also other types than a seven-segment display, such as 9, 14 or 16 segment displays may be realized similar manner by the present technology.

FIGS. 7a-7c illustrate, at 700, a further embodiment of the multilayer structure in three different degrees of completion. In FIG. 7a is shown a substrate film 108 having two light-defining segments 112 that both has two optically functional elements 106 and a first additional film upon the first side of the substrate film 108. The first additional film contains upon or in those two light-defining segment 112 an optional informative element 116. At least one informative element 116 is selected from the group consisting of: optical surface relief form, optical surface relief form structure, optical grating structure, printing, printed letter, printed number, printed shape, printed image, printed graphics, and engraved letter, number, shape, image or graphics. In FIG. 7b is shown a light-blocking layer 104 having structural channels 110 that configures of at least partially the transmissive layer 103 upon the first side of the substrate film 108. Proximal ends of the structural channels 110 extend from the contact of the light-defining segment 112 in a first direction (D1), coinciding with a thickness direction of the structure, towards the selected top of the structure. There may be at least one additional layer upon the light-blocking layer 104 and transmissive layer 103 constituting possibly a top cover of 700, as shown in FIG. 7c.

FIGS. 8a-8c show at 800 a variation of the structure that differs from 700 in that it includes optional informative elements 116 in the at the at least one additional film or layer 118 that is upon the two light-defining segments 112 and respective structural channels 110, instead in the first additional film upon the first side of the substrate film 108. FIG. 8a further shows that a substrate film 108 may comprise a through-moulding hole 124 or e.g., a weakened portion such as a blind-hole or a cut through which molded plastics is designed to flow e.g., in molten state from a side to another during molding, such as from the second side to the first sides, as depicted in this example.

Figure 9:
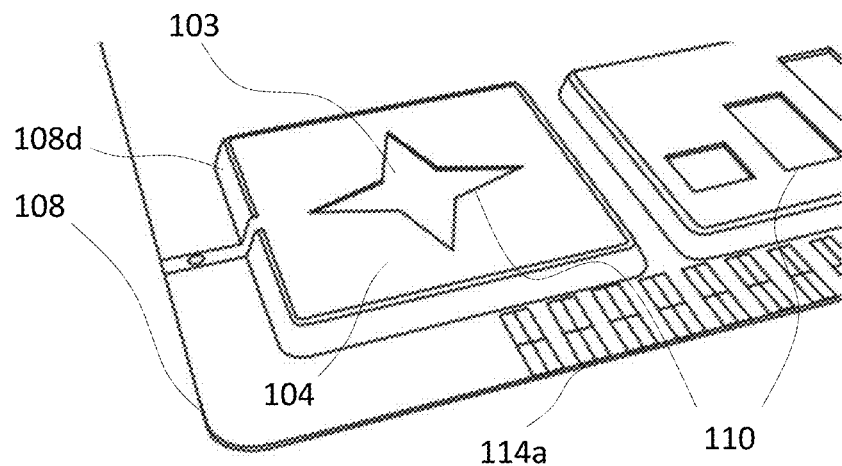
FIGS. 9 and 10 illustrate still further variations of multilayer structures in accordance with the present disclosure.

FIG. 9 illustrates, at 900, a further embodiment of the multilayer structure. A number of portions of the substrate film 108 is 3D-formed into at least one receptacle, recess or pocket or alike shape 108d. In this design, the light-blocking layer 104 and transmissive layer 103 configures at least partially of the internals of the pocket 108d extending towards the environment in first direction.

The pocket 108d of the substrate film 108 accommodates at least one optically functional element 106 (not shown in the figure) embedded at least partially in the material of the transmissive layer 103 inside the structural channels 110 of the light-blocking layer 104. An interior wall(s) of the pocket 108 is(are) at least partially contacted with the material of the light-blocking layer 104 that forms therefore at least partially an interface with the inside part of the pocket 108d. There may be one or more structural channels 110 configured of at least partially of the material of the transmissive layer 103 in one pocket 108d, as shown in FIG. 9.

Figure 10:
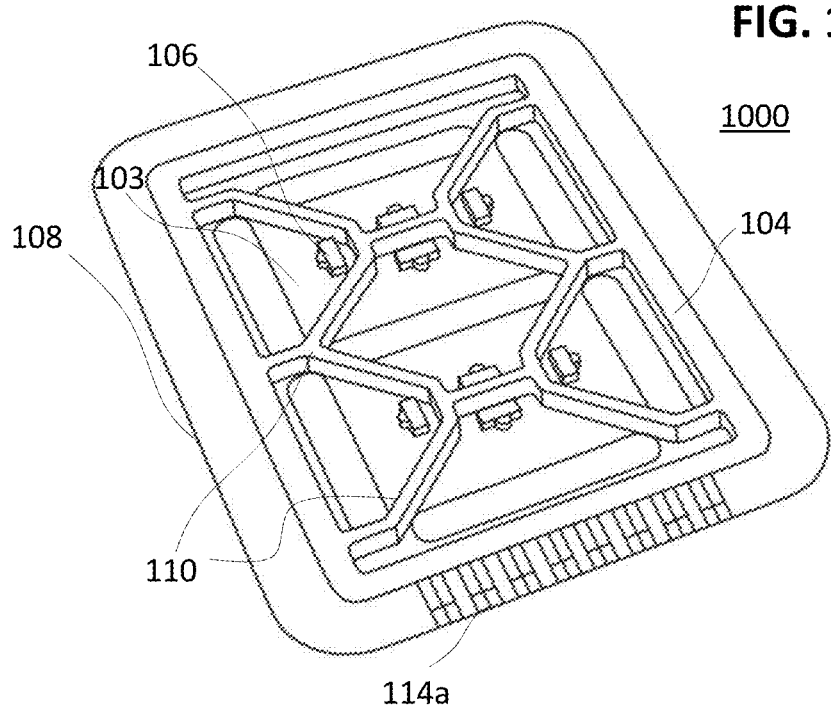

FIG. 10 illustrates, at 1000, a further embodiment of the multilayer structure. At least a portion of the light-blocking layer 104 forms a number of cellular forms or cell shapes of the structural channels 110 that are at least partially configured of the transmissive layer 103.

The shown design of 1000 incorporates a cellular arrangement of the structural channels 110 of the light-blocking layer 104. Such a design makes possible to manufacture a very compact multilayer structure.

Figure 11:
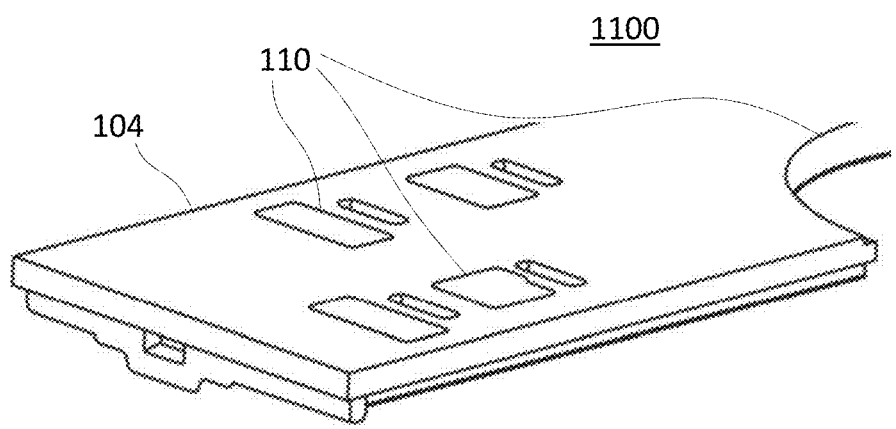
FIG. 11 illustrates an embodiment of a light-blocking layer.

FIG. 11 illustrates, at 1100, an embodiment of a light-blocking layer 104 in accordance with the present disclosure. In the manufacturing of the multilayer structure the light-blocking layer 104 may be a ready-made layer or element or it 104 may be prepared in the manufacturing process of the structure, preferably by moulding as described hereinelsewhere.

Figure 12:
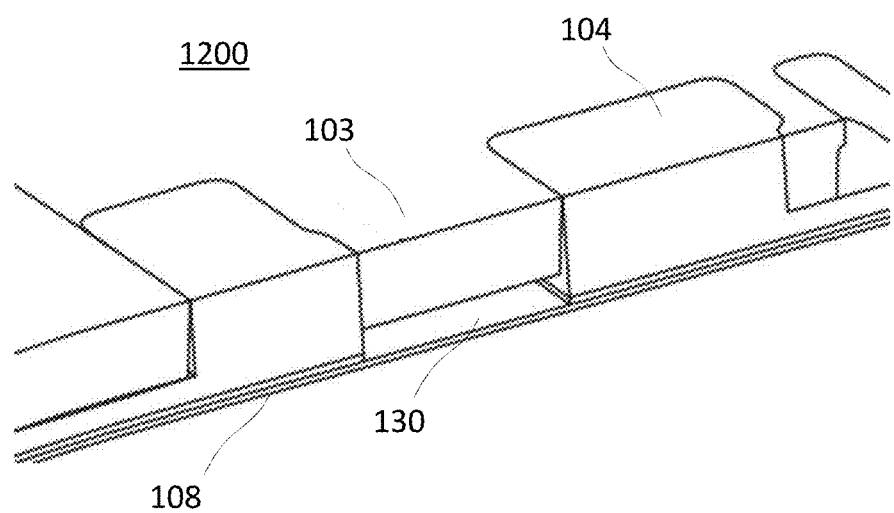
FIG. 12 illustrates still a further variation of a multilayer structure in accordance with the present disclosure.

FIG. 12 illustrates, at 1200, a further embodiment of the multilayer structure and particularly one example how different materials or layers of the structure can overlap each other. At least a portion of the light-blocking layer 104 and/or the transmissive layer 103 may locate at the outer edge of the structure. The structure may comprise a number of hollow portions 130 between the layers or films of the structure.

The shown design of 1200 comprises a hollow portion 130 on the first side of the substrate film 108 extending to an outer edge of the structure. The portion 130 is sandwiched in the first direction between the substrate layer 108 and the transmissive layer 103. This 130 may allow interface an electrical component or element such as a sensor inside the structure to an external device or structure.

Alternatively, the portion 130 may be sandwiched in the first direction between the substrate layer 108 and the light-blocking layer 104.

The hollow portion 130 can be manufactured e.g., so that the volume of the portion 130 desired is first filled e.g., by injecting or moulding with sacrificial material that is then removed from the structure in the postprocessing phase. The sacrificial material may be removed from the structure to provide the hollow portion 130 by exposing the sacrificial material to irradiation or a suitable chemical, for example.

As appreciated by a person skilled in the art, a hollow portion 130 may locate also in other fashion than in 1200. It 130 may locate e.g., in top of the functional element 106 or other electrical components such as a detector or sensor, for example.

Figure 13:
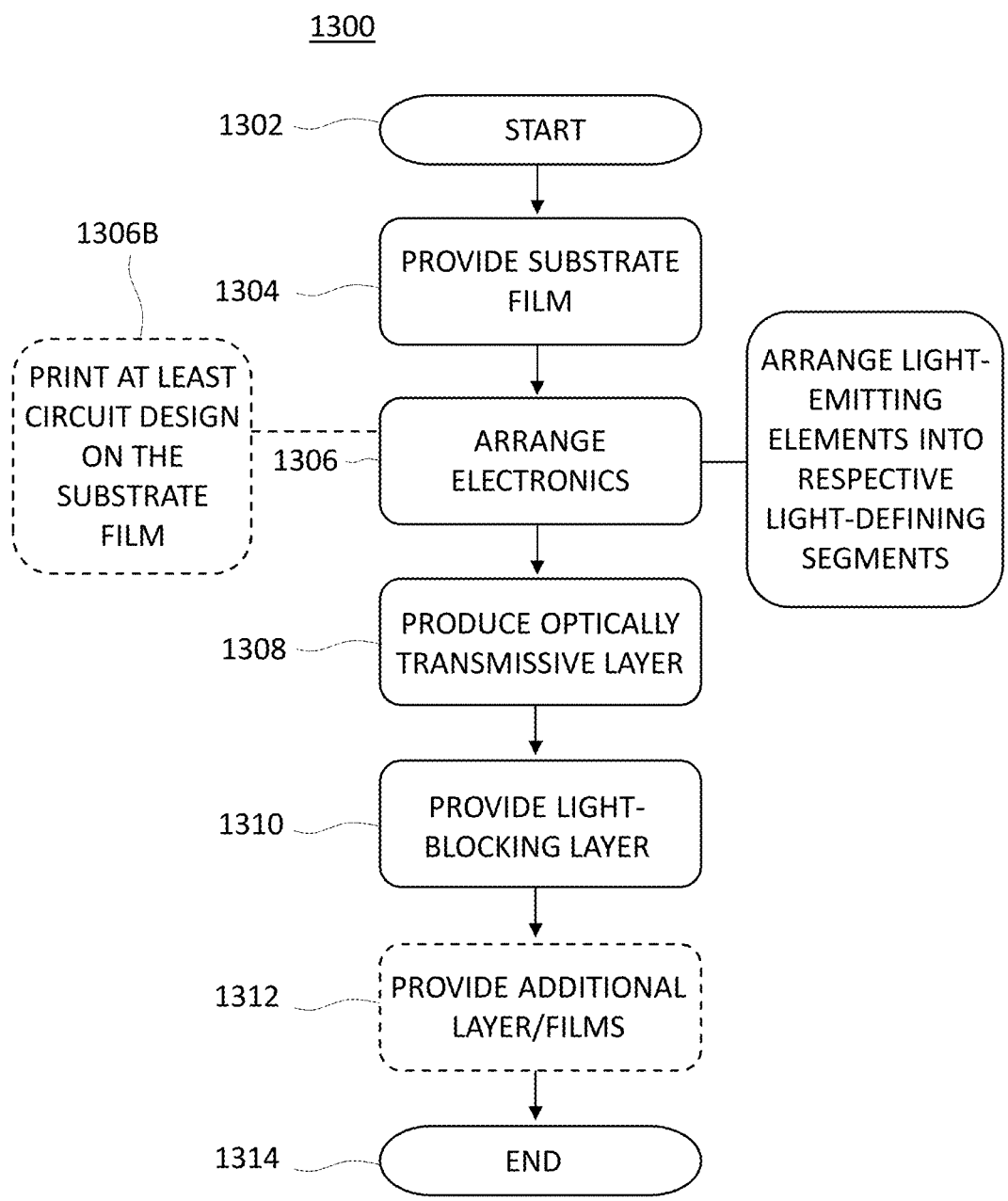
FIG. 13 is a flow diagram disclosing an embodiment of a method m accordance with the present disclosure.

FIG. 13 includes a flow diagram 1300 disclosing an embodiment of a method in accordance with the present disclosure.

At the beginning of the method for manufacturing the multilayer structure, a start-up step 1302 may be executed. During start-up 1302, the necessary tasks such as material, component and tools selection, acquisition, calibration and other configuration activities may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, casting, lamination, (thermo)forming, cutting, drilling and/or printing equipment, among potential others, may be thus ramped up to operational status at this stage. Mould(s) may be prepared with necessary surface forms, etc.

At 1304, at least one, optionally thermoplastic, formable substrate film 108 for accommodating electronics is provided. A ready-made element of substrate material, e.g., a roll or sheet of plastic film, may be acquired. In some embodiments the substrate film 108 itself may be first produced in-house by moulding, extrusion or other methods from the desired source material(s). In some embodiments, the substrate film 108 may be manufactured from selected source or raw materials. Optionally, the substrate film 108 is processed. It may be, for example, coated, cut and/or provided with openings, notches, recesses, cuts, etc. as desired. The initial and/or resulting processed film 108 may bear e.g., rectangular, square or circular shape. The substrate film may be either generally or at least selectively in places opaque, translucent or substantially transparent having regard to selected frequencies/wavelengths of light, such as the emission frequencies/wavelengths of the optoelectronic elements such as optically functional elements 106 to be provided thereon. The substrate film 108 may comprise thermoplastic material but as discussed hereinelsewhere, a great variety of mutually rather different materials are applicable for use in substrate and other films considered herein.

At 1306, the substrate film 108 is arranged with electronics including a number of optically functional elements 106 that are disposed on respective light-defining segments 112 of the first side of the substrate film and a circuit design comprising a number of circuit traces 114 connecting to the number of optically functional elements 106, potentially with one or more other electronic components such as a power circuitry, sensing circuitry and/or control circuitry (e.g. a microcontroller, processor, signal processor, programmable/programmed logic chip, etc.). Each segment 112 may comprise one or more optically functional elements 106. In practice, e.g., a number of ready-made components such as various SMDs (surface-mount device) may be attached to the selected contact areas of the film 108 by solder and/or adhesives, for instance.

At optional 13066 at least part of the electronics, preferably at least the circuit design, is produced by printed electronics technology on the substrate film 108. At 806B a number of conductive circuit traces 114 defining e.g., a number of conductor lines of a desired circuit design or circuit pattern, and/or contact pads (or other contact areas) for electrically coupling electronic and optoelectronic components such as optically functional elements 106, and optionally power (supplying) circuitry and/or control circuitry, are provided on the substrate film 108, preferably by one or more techniques of printed electronics with reference to related additive technologies. For example, screen, inkjet, flexographic, gravure or offset lithographic printing may be utilized. However, more traditional such etching based methods may be considered as well, provided that e.g., the used materials of the substrate film 108 are compatible therewith. Also, further actions cultivating the substrate film involving e.g. printing or other provision of colour layers, graphics, visual indicators, coatings, etc. may take place here.

Alternatively or additionally, printed electronics technology may be applied to actually manufacture at least part of the components, such as OLEDs, directly onto the substrate film 108. Each included optically functional element may be optionally individually selected, manufactured or otherwise configured to emit e.g., white light or just selected wavelengths/frequencies (colours), not forgetting potential non-visible wavelengths.

How the electronics such as optically functional elements 106 may be dimensioned, aligned or positioned either mutually or relative to other features of a multilayer structure under construction has been deliberated hereinearlier. In brief, the mutual positioning of various elements shall be selected such that desired overall performance goals in terms of e.g., uniformity of light outcoupled or incoupled via a selected surface and/or optical efficiency are fulfilled. Yet, there may be e.g., aesthetic goals that affect the positioning of electronics and/or masking or blocking elements such that the electronics are not visible from outside the finished multilayer structure.

In some embodiments, the substrate film 108 and/or other film(s) to be included in the multilayer structure may be formed to exhibit a desired 3d-shape (at least locally a substantially non-planar shape), preferably through a step of thermoforming such as vacuum or pressure forming. Also cold forming may be applicable. Having regard to forming techniques e.g., the aforesaid pressure forming may be applied to provide the substrate with precise, sharp details; pressure forming may also be generally preferred when the substrate lacks (through-)moulding holes that could enable undesired flow and resulting pressure drop via them. The thermoforming step may be executed subsequent to arrangement of electronics 1306 to avoid related 3D assembly. However, it is alternatively or additionally possible to execute 3D forming already prior to step 1306.

At 1308, an optically transmissive layer 103 is produced upon the first side of the substrate film 108 so that at least the light-defining segments (112) including the number of optically functional elements (106) are at least partially embedded in and optically coupled to the transmissive layer (103), preferably directly produced from the concerned material(s), e.g., through moulding or casting, upon the substrate film 108 and at least part of the electronics thereon, such as a number of optically functional elements 106.

At least one piece of the material of the transmissive layer 103 may be laminated with the substrate film 108, optionally preceding by providing an adhesive layer between the transmissive layer 103 and the substrate film 108.

At 1310 an optically substantially opaque light-blocking layer 104 is provided and further disposed onto the first side of the substrate film, and hence, further securing the transmissive layer 103 between the light-blocking layer 104 and the substrate film 108, as described hereinabove. The light blocking layer 104 is configured to define a number of structural channels 110 whose proximal end is upon the respective light-defining segment 112, wherein the transmissive layer 103 establishes at least partially the internals of the structural channels 110 extending in a first direction D1, coinciding with a thickness direction of the structure, towards the selected top of the structure.

The light blocking layer 108 may be as discussed hereinbefore, may be executed through moulding either part of the layer 104 or whole 104, for instance, or a pre-prepared sub-assembly of the layer 104 may be used.

In practice, the substrate film 108 may be used as an insert e.g., in an injection molding process. Selected areas of the film such as edges may be left free from the molded plastics if desired. In some embodiments, even both sides of a film could be provided with molded layer(s). A substrate film could comprise a through-moulding hole or e.g., a weakened portion such as a blind-moulding hole or a cut through which molded plastics is designed to flow e.g., in molten state from a side to another during moulding.

At least one piece of the material of the light-blocking layer 104 may be laminated with the substrate film 108, optionally preceding by providing an adhesive layer between the light-blocking layer 104 and the substrate film 108.

Preferably at least part of the electronics such as the optically functional elements 106 and/or other elements provided to the substrate are thereby at least partially embedded within the provided material(s). Accordingly, optical coupling between the optically functional elements 106 and the transmissive layer 103 inside the structural channels 110 of the light-blocking layer 104 may be made efficient and associated coupling losses reduced.

Item 1312 refers to possible task of providing one or more second additional, optically functional, optionally diffusive, films or layers upon a distal end of at least one structural channel 110 of the number of the structural channels 110.

In one embodiment the method comprises at least one further step e.g., between the third 1308 and fourth step 1310, wherein it is provided potentially selectively a cladding layer 128 between the blocking layer 104 and the transmissive layer 103. At 1314, the method execution is ended.

Figure 14:
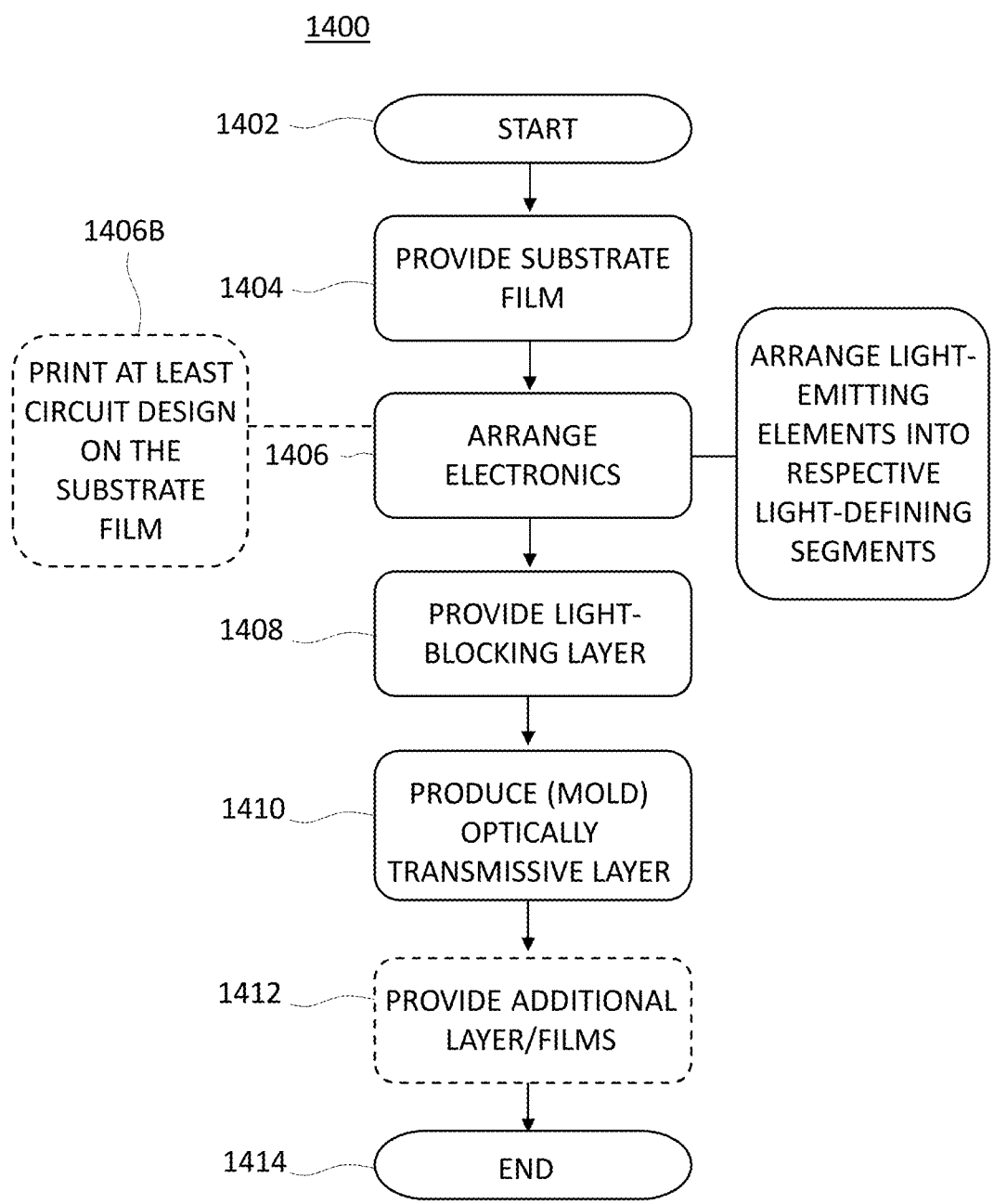
FIG. 14 is a flow diagram discloses an alternative method to produce a multilayer structure.

FIG. 14 includes a flow diagram 1400 disclosing an alternative way of producing a multilayer structure.

Method of 1400 is otherwise similar to method of 1300 but differs in that an optically light-blocking layer 104 is provided at step 1408 prior to producing of a light-blocking layer 104 at step 1410.

Step 1408 comprises the subject matter described above for step 1310. At 1408 an optically substantially opaque light-blocking layer 104 is provided and further disposed onto the first side of the substrate film 108, wherein the light blocking layer 104 defines a number of structural channels 110 whose proximal end extends from the contact of the light-defining segment 112 in a first direction D1, coinciding with a thickness direction of the structure, towards the selected top of the structure.

Step 1410 comprises the subject matter described above for step 1308. At 1410 an optically transmissive layer 103 is produced upon the first side of the substrate film 108 so that the material(s) establishes a light conveying transmissive internals of the structural channels 110 of the light-blocking layer 104, preferably directly produced from the concerned material(s), e.g., through moulding or easting, upon the substrate film 108 and at least part of the electronics thereon, such as a number of optically functional elements 106.

At 1410 at least one piece of the material of the light-blocking layer 104 may be used as an insert in moulding of the transmissive layer 103 preferably so that the optically transmissive layer 103 is at least partially moulded between the light-blocking layer 104 and the first side of the substrate film 108.

As described hereinelsewhere, the light-blocking layer 104 may be provided by moulding it, at least partially, from at least one source material such as plastics.

Figure 15:
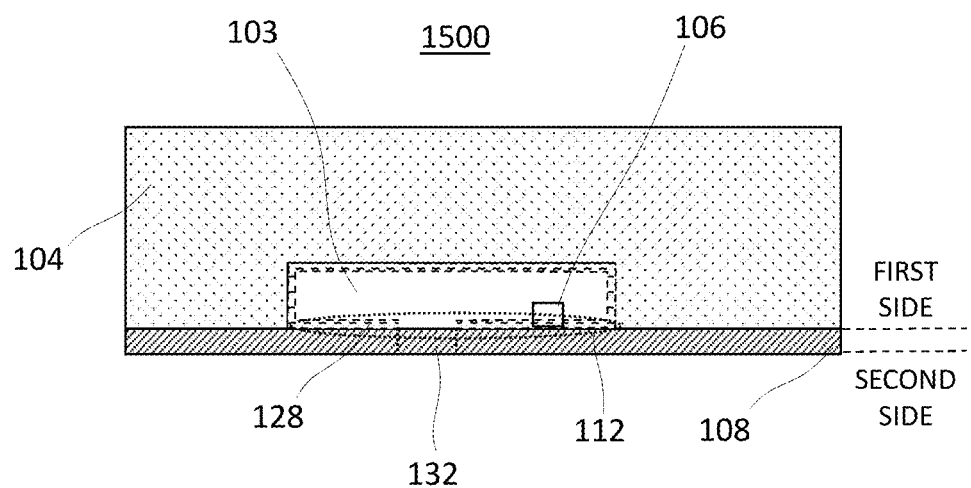
FIG. 15 is still a further variation of a multilayer structure in accordance with the present disclosure.

FIG. 15 illustrates, at 1500, a further embodiment of the multilayer structure. It 1500 differs from the variations of the multilayer structure described hereinbefore in that the at least one optically functional element 106 is optically coupled via the transmissive layer 103 through the substrate film 108 to an environment locating upon the second side of the substrate film 108.

In the design of 1500 light may be arranged to pass selectively through the substrate film 108 via an exit portion 132 of the substrate film 108. The exit portion 132 is therefore at least partially optically transmissive. The exit portion 132 may optionally comprise an optically functional element such as a light diffuser, lens or diffractive element, for example.

The structural channel(s) created by the light blocking layer 104 may extend in a width or second direction (D2) possibly even more dominantly than in the thickness or first direction (D1).

The design 1500 optionally comprises a potentially selectively provided cladding layer 128 between the blocking layer 104 and the transmissive layer 103, and/or on the first side of the substrate film 108.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. A method for manufacturing an optoelectronically functional multilayer structure, comprising:
a first step of providing an optionally thermoplastic, formable substrate film comprising a first and opposite second side;
a second step of arranging the substrate film with electronics, wherein the electronics includes a number of optically functional, preferably light-emitting and/or light-sensitive, elements disposed on respective light-defining segments of the first side of the substrate film and a circuit design comprising a number of circuit traces connecting to the number of optically functional elements;

a third step of producing, preferably by moulding, an optically transmissive layer upon the first side of the substrate film so that at least the light-defining segments including the number of optically functional elements are at least partially embedded in and optically coupled to the transmissive layer; and a fourth step of providing a light-blocking layer upon the substrate film and further securing the transmissive layer between the light-blocking layer and the substrate film, the light-blocking layer defines a number of structural channels whose proximal ends are upon the respective light-defining segment, wherein the transmissive layer establishes at least partially the internals of the structural channels extending in a first direction (D1), coinciding with a thickness direction of the structure;

wherein the fourth step includes forming at least one recess from the number of structural channels so that a proximal end of the at least one recess is upon the respective light-defining segment and a distal end of the at least one recess forms a top of the recess, the recess extending in the first direction (D1) from the respective light-defining segment and the top of the at least one recess being in the proximity of another side of the light-blocking layer, wherein the thickness of the light-blocking layer in the respective recess is locally reduced.

2. The method of claim 1, wherein the fourth step includes forming at least one opening from the number of structural channels through the light-blocking layer in the first direction (D1) preferably so that a proximal end of each of the at least one opening is upon the respective light-defining segment and a distal end of each of the at least one opening defines an exit on another side of the light-blocking layer.

3. The method of claim 1, wherein the third step includes moulding the optically transmissive layer, at least partially upon the first side of the substrate film, wherein the transmissive layer comprises a thicker portion of the material of the transmissive layer in the first direction (D1) upon at least one light-defining segment to establish at least partially the internals of at least one structural channel.

4. The method of claim 1, wherein the third step includes laminating of at least one piece of the material of the optically transmissive layer with the substrate film, optionally preceding by providing an adhesive layer between the optically transmissive layer and the substrate film.

5. The method of claim 1, wherein the fourth step includes laminating of at least one piece of the material of the light-blocking layer with the optically transmissive layer, optionally preceding by providing an adhesive layer between the light-blocking layer and the optically transmissive layer.

6. The method of claim 1, wherein the method comprises a further step being subsequent or prior the second step, wherein 3D-shaping, preferably by thermoforming, the substrate film to a selected 3D target shape, wherein optionally the light-defining segments are defined by a form of a recess and/or a protrusion of the substrate film.

7. The method of claim 1, wherein the second step includes arranging into at least one of the light-defining segments at least one electrical element of the electronics selected from the group consisting of light-emitting element, light-sensitive element, photodetector, photovoltaic cell, and pressure-sensitive component.

8. The method of claim 1, wherein the second step includes producing at least part of the electronics, preferably at least the circuit design, by printed electronics technology on the substrate film.

9. The method of claim 1, wherein the fourth step includes moulding the light-blocking layer, at least partially, from at least one source material such as plastics.

10. The method of claim 1, wherein the second step includes providing a masking to the first and/or second side of the substrate film, preferably opaque or translucent, optionally dark-coloured such as substantially black, layer on a base layer accommodating the traces and optionally at least one of the light-emitting elements, optionally film or tape, to block or at least hinder external view of the traces.

11. The method of claim 1, wherein the second step includes providing a first additional film upon the first side substrate film, wherein the first additional film optionally contains upon or in at least one light-defining segment at least one element selected from the group consisting of: optical surface relief form, optical surface relief form structure, optical grating structure, printing, printed letter, printed number, printed shape, printed image, printed graphics, and engraved letter, number, shape, image or graphics.

12. The method of claim 1, wherein the method comprises a further step, wherein providing one or more second additional, optically functional, optionally diffusive, films or layers upon a distal end of at least one structural channel of the number of structural channel, wherein at least one of the second additional films or layers optionally contains at least one element selected from the group consisting of: optical surface relief form, optical surface relief form structure, optical grating structure, printing, printed letter, printed number, printed shape, printed image, printed graphics, and engraved letter, number, shape, image or graphics.

13. The method of claim 1, wherein the method further comprises a step preferably between the third and fourth step, wherein an optical cladding layer is optionally selectively provided between the blocking layer and the transmissive layer.

14. An optoelectronically functional multilayer structure comprising:

an optionally thermoplastic, formable substrate film comprising a first and opposite second side;

electronics comprising a number of optically functional, preferably light-emitting and/or light-sensitive, elements being disposed in respective light-defining segments of the first side of the substrate film, and a circuit design comprising a number of circuit traces connecting to the number of optically functional elements;

an optically transmissive layer upon the first side of the substrate film so that at least part of each of the light-defining segments including the number of optically functional elements, is at least partially embedded in and optically coupled to the transmissive layer; and an optically substantially opaque light-blocking layer disposed onto the first side of the substrate film, the light-blocking layer defining a number of structural channels configured at least partially of the material of the transmissive layer, wherein the number of structural channels being formed to extend at least in a first direction (D1), coinciding with a thickness direction of the structure i) to convey light emitted by at least one of the optically functional elements towards the environment upon the structure and/or convey light onto at least one of the optically functional elements from the environment, so that the light-blocking layer at least partially optically isolates the light-defining segments from each other, and ii) to secure the optically transmissive layer between the light-blocking layer and the substrate film;

wherein at least one structural channel from the number of structural channels is formed to extend through the light-blocking layer in the first direction (D1) preferably so that a proximal end of the at least one structural channel on one side of the light-blocking layer defines at least partly an edge of the respective light-defining segment and a distal end of the at least one structural channel defines an exit on another side of the light-blocking layer.

15. The structure of claim 14, wherein at least one structural channel from the number of structural channels is formed to define a recess into the light-blocking layer so that a proximal end of the at least one structural channel on one side of the light-blocking layer defines at least partly an edge of the respective light-defining segment and a distal end of the at least one structural channel forms a top of the recess in the proximity of another side of the light-blocking layer, wherein the thickness of the light-blocking layer in the respective structural channel is locally reduced.

16. The structure of claim 14, wherein the light-blocking layer and the optically transmissive layer comprise an adhesive layer, optionally heat-activated film, interposed therebetween.

17. The structure of claim 14, wherein the optically transmissive layer and the substrate film comprise an adhesive layer, optionally heat-activated film, interposed therebetween.

18. The structure of claim 14, wherein the electronics comprises at least one electrical element selected from the group consisting of light-emitting element, light-sensitive element, photodetector, photovoltaic cell, and pressure-sensitive component, disposed on at least one of the light-defining segments.

19. The structure of claim 14, wherein at least part of the electronics, optionally of at least the circuit design, being preferably produced by printed electronics technology on the substrate film.

20. The structure of claim 14, wherein the first and/or second side of the substrate film comprises a masking, preferably opaque or translucent, optionally dark-colored such as substantially black, layer on a base layer accommodating the traces and optionally at least one optically functional element, optionally film or tape, to block or at least hinder external view of the traces.

21. The structure of claim 14, wherein the first side of the substrate film comprises a first additional film containing optionally upon or in at least one light-defining segment at least one element selected from the group consisting of: optical surface relief form, optical surface relief form structure, optical grating structure, printing, printed letter, printed number, printed shape, printed image, printed graphics, and engraved letter, number, shape, image or graphics.

22. The structure of claim 14, wherein the structure comprises one or more second additional, optically functional, optionally diffusive, films or layers upon the light-blocking layer, wherein at least one of the second additional films or layers optionally contains at least one element upon a distal end of at least one structural channel of the number of structural channels of the light-blocking layer selected from the group consisting of: optical surface relief form, optical surface relief form structure, optical grating structure, printing, printed letter, printed number, printed shape, printed image, printed graphics, and engraved letter, number, shape, image or graphics.

23. The structure of claim 14, wherein the structure comprises a potentially selectively provided optical cladding layer between the light-blocking layer and the transmissive layer.

\* \* \* \* \*